(12) United States Patent
Vest et al.

(10) Patent No.: US 6,363,505 B1
(45) Date of Patent: Mar. 26, 2002

(54) PROGRAMMABLE CONTROL CIRCUIT FOR GROUNDING UNUSED OUTPUTS

(75) Inventors: W. Bradley Vest, San Jose; Krishna Rangasayee, Mountain View, both of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/323,302

(22) Filed: Jun. 1, 1999

Related U.S. Application Data

(60) Provisional application No. 60/087,613, filed on Jun. 2, 1998, and provisional application No. 60/065,551, filed on Nov. 14, 1997.

(51) Int. Cl.[7] ............ G01R 31/28; G01R 31/30; G06F 11/00
(52) U.S. Cl. ............................. 714/726; 714/745
(58) Field of Search .......................... 714/726, 745

(56) References Cited

U.S. PATENT DOCUMENTS

| 5,319,252 A | | 6/1994 | Pierce et al. ............... 307/263 |
|---|---|---|---|
| 5,337,254 A | * | 8/1994 | Knee et al. .................... 716/1 |
| 5,341,040 A | | 8/1994 | Garverick et al. .......... 307/443 |
| 5,656,949 A | * | 8/1997 | Yip et al. ...................... 326/38 |
| 5,717,343 A | | 2/1998 | Kwong ......................... 326/86 |
| 5,742,178 A | | 4/1998 | Jenkins, IV et al. .......... 326/38 |
| 5,787,011 A | * | 7/1998 | Ko ................................. 716/2 |
| 5,889,788 A | * | 3/1999 | Pressly et al. .............. 714/726 |

\* cited by examiner

*Primary Examiner*—Albert Decady
*Assistant Examiner*—Joseph Torres
(74) *Attorney, Agent, or Firm*—Babak S. Sani; Townsend and Townsend and Crew LLP

(57) ABSTRACT

A circuit for programmably grounding (or coupling to the positive rail) unused outputs to improve noise immunity of the circuit. The circuit of the present invention achieves, for example, programmable grounding of an output via already existing test signal paths, without introducing delays in speed critical output signal paths.

28 Claims, 4 Drawing Sheets

PROGRAMMABLE CONTROL CIRCUIT FOR GROUNDING UNUSED OUTPUTS

This application claims the benefit of priority from provisional application No. 60/087,613, with the same title, filed Jun. 2, 1998, which is a continuation-in-part of commonly-assigned, U.S. Provisional Patent Application No. 60/065,551, entitled "An Integrated Circuit Incorporating a Noise Tolerant Input/Output," by Rangasayee et al., filed Nov. 14, 1997.

BACKGROUND OF THE INVENTION

The present invention relates in general to integrated circuits (ICs), and in particular to apparatus and method for reducing noise by programmably grounding unused output terminals.

Ground bounce refers to a phenomenon in integrated circuits that is a common source of undesirable noise. Input/output (I/O) circuits typically include relatively large pull-down and pull-up transistors to enable the IC to drive heavy external loads. The pull-down transistor that connects the output node to ground, can therefore sink large amounts of current. These output transistors connect to an external pin that is usually loaded with a sizable amount of parasitic inductance. When the pull-down transistor is switched on, this parasitic inductance fights the instantaneous discharge of the output node, and causes momentary ringing on the internal ground node. This ground bounce noise is exaggerated when, on the same device, there are a number of I/Os that switch at the same time. An example of the type of IC that may have large numbers of I/Os switching simultaneously is the programmable logic device. If the amplitude of the ground bounce in the device exceeds the noise margin of another device it is driving, it may trigger momentary switching of input transistors in the other device when the intended signal from the ground bounce device is a logic low level. A ground bounce in the negative direction may cause false switching of input transistors in the ground bounce device itself, if the level of the input signal is not low enough.

Circuit designers have used various different techniques to reduce ground bounce. While techniques such as connecting decoupling capacitors very close to the ground and other power pins has helped reduce ground bounce, ground bounce remains a problem especially in high speed devices with a large number of I/O pins. There is, therefore, always room for improving the noise immunity of integrated circuits against ground bounce.

SUMMARY OF THE INVENTION

According to the present invention, in integrated circuits that may have a number of output pins, some of which may be unused at any given time, instead of leaving an unused output pin in a tri-state mode, noise immunity is enhanced by coupling the unused outputs to a power bus such as ground. The additional lead and board capacitance associated with the unused output pad adds extra ballast capacitance to ground when the node is grounded, helping to reduce ground bounce when other outputs switch. In one embodiment, the control circuitry for grounding the unused output pins is made user programmable to make more efficient use of the internal circuitry. In a preferred embodiment, the programmable grounding of the unused output pin is achieved without compromising the speed of the data path when the output is being driven. In a specific embodiment intended for programmable logic devices having programmable logic cells, or macrocells, resources from an output macrocell are used to programmably ground an unused output pin, without sacrificing the utility of the output macrocell as a buried macrocell.

Accordingly, in one embodiment, the present invention provides, in an integrated circuit, an output circuit for driving an output node, including a test circuit path coupling a signal from internal output testing circuitry to the output node, and a speed critical circuit path coupling a signal from internal logic circuitry to the output node; wherein, when the output node is unused, the output circuit couples the output node to an internal power bus via the test circuit path.

In another embodiment, the present invention provides an integrated circuit including internal circuitry configured to perform logic functions, an output driver circuit having a first input coupled to an output enable signal and a second input coupled to an output data signal, and an output connected to an output pad; and programmable ground circuitry having a speed critical signal path coupled between the internal circuitry and the output driver circuit, and a test signal path coupled between a programmable ground signal and the output driver circuit, wherein, in a first mode of operation, the output driver circuit responds to a signal from the speed critical signal path, and in a second mode of operation the output driver circuit drives the output pad to ground in response to the programmable ground signal from the test signal path.

In yet another embodiment, the present invention provides a programmable logic device including a plurality of macrocells interconnected by an array of interconnect lines, boundary scan testing circuitry, and a plurality of output circuits driving a respective plurality of output nodes, wherein each one of the plurality of output circuits includes a programmable element for grounding an associated output node via the boundary scan testing circuitry, when the associated output node is unused.

The following detailed description and the accompanying drawings provide a better understanding of the nature and advantages of the programmable rounding technique of the present invention.

DESCRIPTION OF THE SPECIFIC EMBODIMENTS

Figure 1:
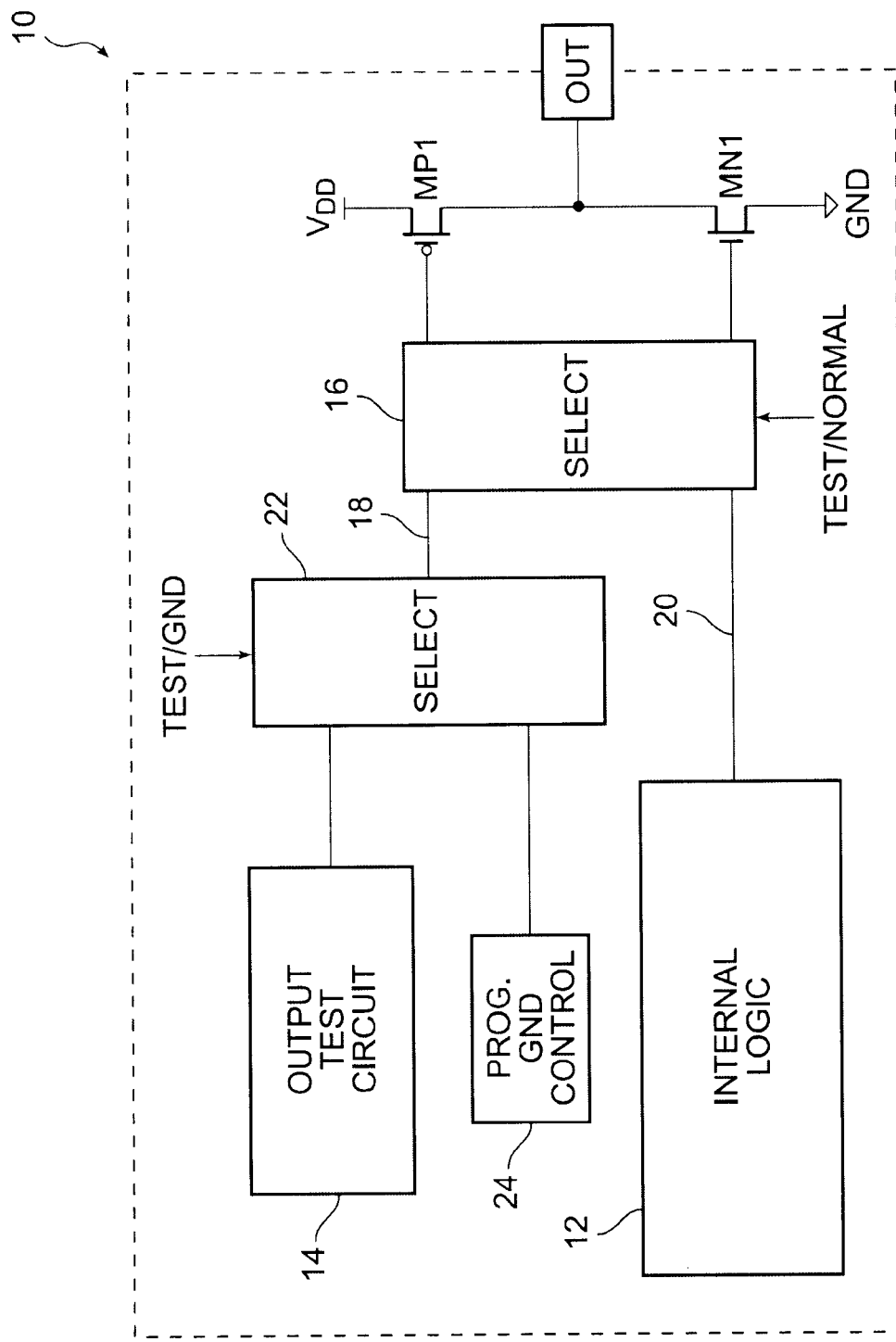
FIG. 1 is a simplified block diagram of an integrated circuit having the programmable output pin grounding mechanism according to the present invention.

Referring to FIG. 1, there is shown a simplified block diagram of an integrated circuit 10 having the programmable output pin grounding mechanism according to the present invention. As many types of integrated circuits include output test circuitry (e.g., to perform JTAG boundary scan testing), in addition to internal logic 12, integrated circuit 10 includes output test circuit 14. A selection circuit 16 has one input 18 connected to the test circuit path and another input 20 connected to the logic circuit path. Depending on the mode of operation as determined by the control signal TEST/NORMAL, selection circuit 16 selects a signal from one of its two inputs to drive output pull-up and pull-down transistors MP1 and MN1. Accordingly, when integrated circuit 10 is in test mode, the output transistors are controlled by signals from output test circuit 14, and when it is in normal mode, signals from internal logic 12 drive the output transistors.

In many applications, there also exists a mode of operation wherein a particular output pin is unused. Typically, such an unused output is tri-stated. Instead of tri-stating an unused output pin, however, the present invention connects an unused output pin to ground to have its parasitic capacitance coupled to the internal ground GND of the output circuit. This additional capacitance provides further filtering of the ground noise and enhances the noise immunity of the integrated circuit. The grounding of an unused output pin, according to the present invention, is implemented along the test circuit path in order to avoid introducing any delays along the normal circuit output path, which is often a speed critical path, from internal logic 12. Another selection circuit 22 is thus provided between selection circuit 16 and output test circuit 14, with one input receiving signals from output test circuit 14, and another input receiving the output grounding signal from programmable ground control 24. In a preferred embodiment, the output grounding signal is made user programmable. Thus, programmable ground control may be a reprogrammable element, such as an SRAM or EEPROM cell, or the like.

Accordingly, when an unused output is detected, programmable ground control 24 supplies an appropriate signal through selection circuits 22 and 16 to the output transistors, to turn on transistor MN1, and turn off transistor MP1. This causes output node OUT to be driven to ground node GND, adding additional ballast capacitance to internal ground node GND. As the programmable ground is accomplished through the test circuit path, the speed of the normal circuit path from internal logic 12 to the output transistors is thus not compromised. It is to be understood that the noise reduction technique of the present invention applies to any power bus on an integrated circuit, including positive (VCC), negative (VSS) or ground power buses. That is, while the specific embodiment of the invention as described herein is primarily concerned with noise on the ground bus GND (or a negative power bus VSS for circuits running with a negative power supply), the same principles apply to noise reduction on the positive power bus VCC. To increase the noise decoupling capacitance of the VCC node, control circuit 24 would be configured to turn on transistor MP1 and turn off transistor MN1 that drive an unused output pin.

Figure 2:
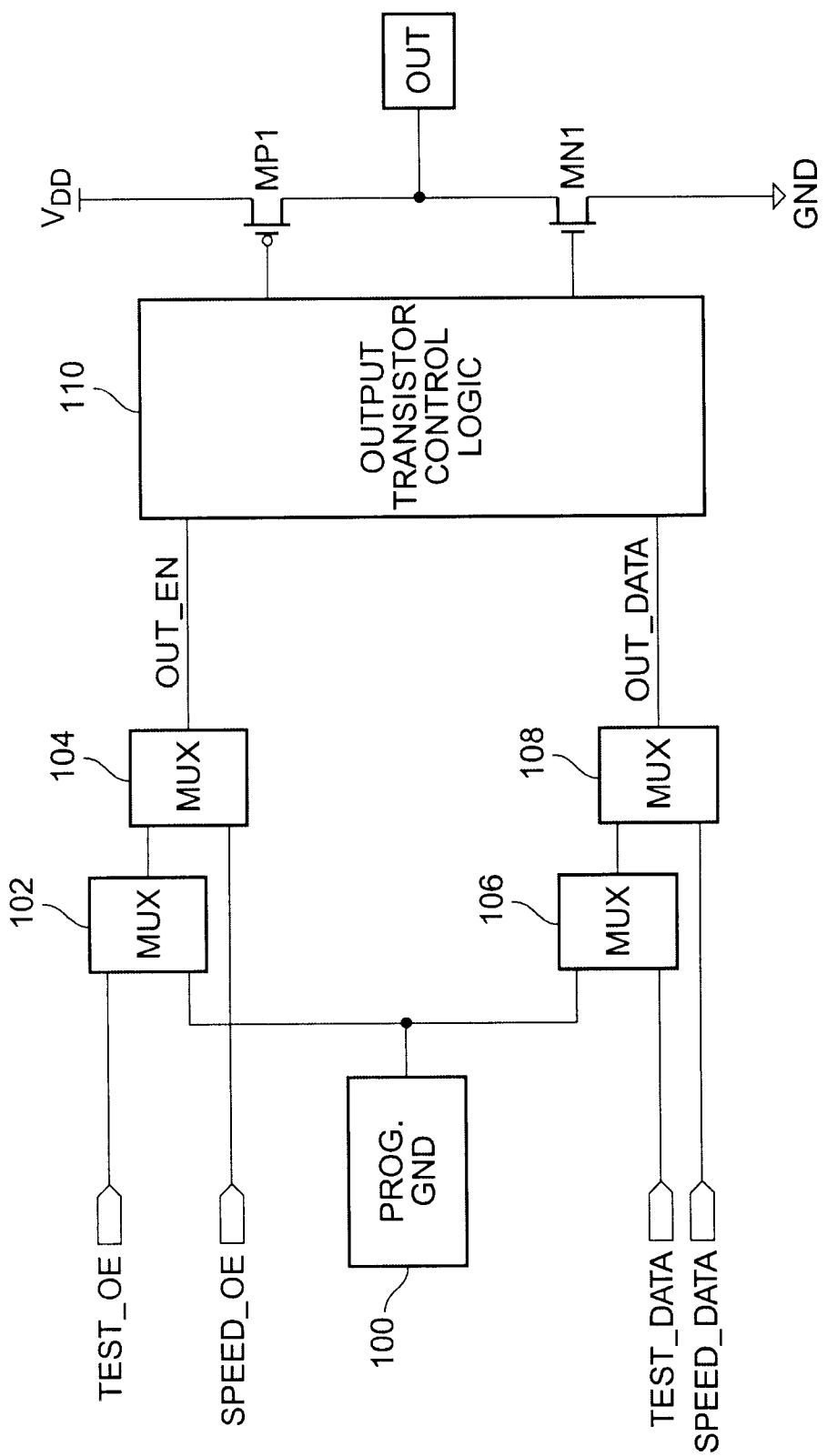
FIG. 2 is a block diagram of a specific embodiment of an output circuit for programmable grounding of an output node according to the present invention.

Referring to FIG. 2, there is shown a block diagram of a specific embodiment for the output circuit with programmable grounding of the output node according to the present invention. This embodiment uses a programmable element 100 to allow the user to programmably control the grounding of the output. Programmable element 100 may be implemented by a variety of different reprogrammable technologies including volatile or non-volatile memory, and the like. The exemplary circuit of FIG. 2 includes a first (output enable) path with a first selection circuit or multiplexing circuit MUX 102 followed by a second MUX 104, and a second (output data) path with a first MUX 106 followed by a second MUX 108. The first MUX (102, 106) in each path multiplexes between the programmable ground PROG_GND and a respective test signal (TEST_OE and TEST_DATA), while the second MUX (104, 108) multiplexes between the output of the first MUX and a speed critical signal (SPEED_OE and SPEED_DATA). The outputs of the second MUXes drive an output transistor control logic 110 whose outputs control pull-up and pull-down transistors MP1 and MN1.

The circuit of FIG. 2 allows the user to program programmable element 100 to drive a particular output to ground. In case of an unused output pin, programmable element 100 can be programmed to a logic state that causes output transistor control logic 110 turn on pull-down transistor MN1, connecting the output pad OUT to the internal ground node GND. A more detailed circuit implementation for performing this function will be described in connection with FIG. 3. With the unused output node OUT driven to ground, the additional lead and board capacitance associated with the output pad adds extra ballast capacitance to the internal ground node GND for the input/output circuitry. This additional capacitance helps the GND node fight ground bounce when other outputs switch.

As ground bounce is of particular concern in high speed circuits, it is desirable that any circuitry that is added for reducing ground bounce, not compromise the speed critical paths of the internal circuitry. It is an advantage of the present invention that the addition of the programmable grounding circuitry according to this embodiment, does not adversely impact existing speed paths. This is accomplished by multiplexing the programmable ground path with other non-speed critical outputs, such as those required by certain internal test functions. As printed circuit boards have become increasingly complex with dense multilayer structures having surface-mounted ICs on both sides of each board, it became necessary to develop standardized boundary scan testing mechanisms to facilitate the testing of the integrity of component I/Os and interconnections. Many types of modern ICs, including microprocessors, memory circuits, programmable logic devices, digital signal processors, and the like, provide on-chip circuitry such as a chain of shift registers and test pins (not shown) for on-chip boundary scan testing that complies with the industry standard (IEEE standard 1149.1). A specific example of the implementation of the standard boundary scan circuitry can be found in programmable logic devices manufactured by ALTERA Corporation, a description of which is provided in chapter 11 of the 1998 ALTERA Data Book under JTAG mode (pages 698–699, and 713–716), hereby incorporated by reference for all purposes. Within these ICs, therefore, there already exists a test path to the I/O circuitry that is separate from the logic path. The present invention takes advantage of these separate paths to ensure that the speed of the logic path is not compromised.

Accordingly, the programmable ground circuitry in the present invention is multiplexed with the test circuitry, leaving the speed critical logic path undisturbed. Referring back to FIG. 2, the multiplexing of the programmable ground is implemented by primary MUXes 102 and 106 wherein PROG_GND is multiplexed with TEST_OE and TEST_DATA. The signal TEST_OE controls the output enable function during testing and the signal TEST_DATA carries test data during testing. Speed critical signals SPEED_DATA and SPEED_OE go through an already existing level of multiplexing (MUXes 104 and 108).

Figure 3:
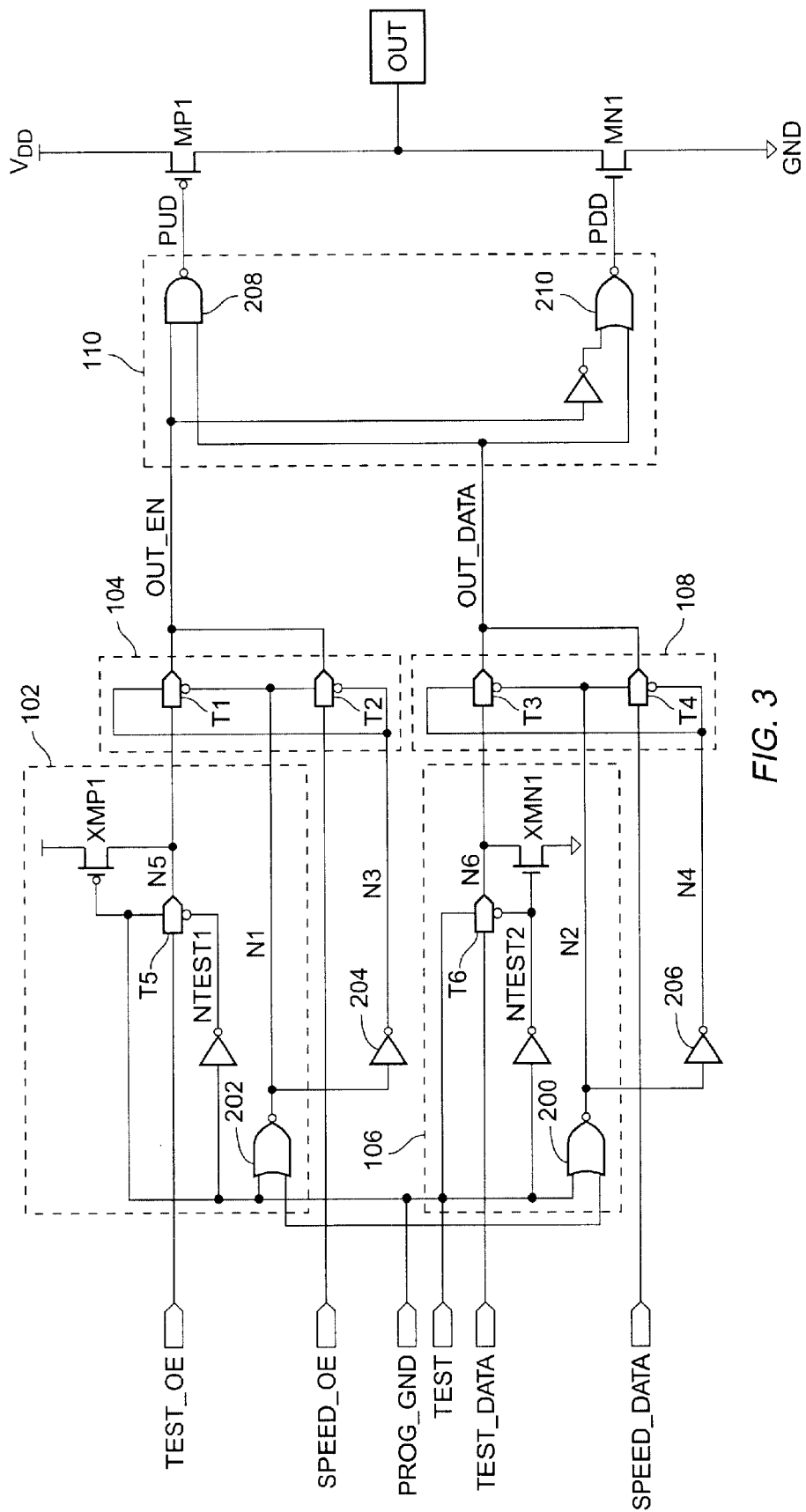
FIG. 3 is an exemplary circuit implementation of the programmable output control circuit according to the present invention.

FIG. 3 is an exemplary circuit implementation of the programmable output control circuit according to the present invention. The same signal names and reference numerals are used in FIG. 3 to refer to roughly the same elements in FIG. 2. The blocking of the circuitry shown in FIG. 3 is not identical to that of FIG. 2 due to the particular circuit implementation combining the first level multiplexing and the control logic for the multiplexers. The operation of this circuit will be better understood by considering each of the various modes of operation as described below.

In a first mode of operation, herein referred to as normal mode of operation, output pad OUT is driven by internal logic circuitry. Therefore, in this mode, the state of the input signals are as follows: TEST_OE, PROG_GND, TEST, and TEST_DATA are all at a logic low level, and SPEED_OE is at a logic high level to allow the output driver circuit to respond to signals arriving on SPEED_DATA. With both TEST and PROG_GND at logic low, NOR gates 200 and 202 generate a logic high signal at their respective outputs, nodes N1 and N2, and a logic low signal at nodes N3 and N4 after an inversion by inverters 204 and 206. The signals on N1, N2, N3, and N4 control the transmission gates T1, T2, T3, and T4 in MUXes 104 and 108. Transmission gates T1, T2, T3, and T4 are preferably implemented by a pair of CMOS transistors, wherein the input with the bubble indicates the gate terminal of the p-channel transistor, and the other input the gate terminal of the n-channel transistor. Thus, with nodes N1=N2=high and N3=N4=low, transmission gates T1 and T3 are turned off while transmission gates T2 and T4 are turned on and conductive. This state of MUXes 104 and 108 effectively isolates the test and programmable ground circuitry, and makes the output driver responsive to the signals SPEED_OE and SPEED_DATA. Accordingly, the high state of SPEED_OE appears at node OUT_EN, and the signal on SPEED_DATA is transferred (via the single transmission age T4) to node OUT_DATA. In response to a high logic level at OUT_EN, NAND gate 208 and NOR gate 210 in control logic 110 become effectively inverters, allowing the signal on OUT_DATA to drive pull-up and pull-down transistors MP1 and MN1.

In a second mode of operation, referred to herein as test mode, the output driver circuitry is configured to process test data. In this mode, signals TEST_OE and TEST are at a logic high level, and PROG_GND is at a logic low level. With signal TEST at a logic high level, nodes N1 and N2 are low and node N3 and N4 are high. This reverses the state of the transmission gates in MUXes 104 and 108, so that transmission gates T1 and T3 are turned on and conductive, while transmission gates T2 and T4 are turned off. At the same time, a logic high level at TEST turns on transmission gate T5 allowing it to pass the signal on TEST_OE through to a conductive transmission gate T1, and to node OUT_EN. Similarly, on the bottom half of the circuit, a high logic level at TEST turns on transmission gate T6 allowing it to pass the signal on TEST_DATA through to a conductive transmission gate T3, and to node OUT_DATA. Thus, when TEST_OE (and thus OUT_EN) is high, output pad OUT is driven by the signal on TEST_DATA. If TEST_OE is low, both driver transistors MN1 and MP1 are turned off, and the output is tri-stated.

In yet another mode of operation, referred to herein as programmable ground mode of operation, the output driver is configured to drive OUT to ground. This would happen in the case where the output driver is connected to a pin that is unused for the given application. Instead of tri-stating the unused output pin, the programmable ground circuit of the present invention grounds the output node to add its capacitive load to the internal ground node GND. In this mode of operation, the programmable element (100 in FIG. 2) generating the PROG_GND signal is programmed to a high logic level. The signal at TEST is low, while TEST_OE is pulled high. With PROG_GND at a logic high level, NORgates 200 and 202 turn on transmission gates T1 and T3, and turn off transmission gates T2 and T4. This is similar to the test mode, except this time TEST is at a logic low level, which turns off transmission gates T5 and T6. Nodes N5 and N6 are thus no longer driven by TEST_OE and TEST_DATA respectively. Instead, node N5 is pulled up to logic high level by a conductive p-channel transistor XMP1 whose gate terminal receives the signal TEST, and node N6 is pulled low by a conductive n-channel transistor XMN1 whose gate terminal receives the signal NTEST2 which is the inverse of the signal TEST. Thus, OUT_EN is pulled high, and OUT_DATA is pulled low. Accordingly, control logic 110 turns on pull-down transistor MN1 and turns off pull-up transistor MP1, grounding output pad OUT. Note that in this exemplary circuit implementation, the programmable ground mode relies on signal TEST being at a logic low level, and that the test mode of operation overrides the programmable ground mode.

It is to be understood that there are a number of different ways of implementing the circuitry for the programmable grounding scheme such that speed critical paths are not disturbed. The circuit shown in FIG. 3 is only an example of how programmable grounding of the output can be achieved without compromising the speed of the normal data path.

Figure 4:
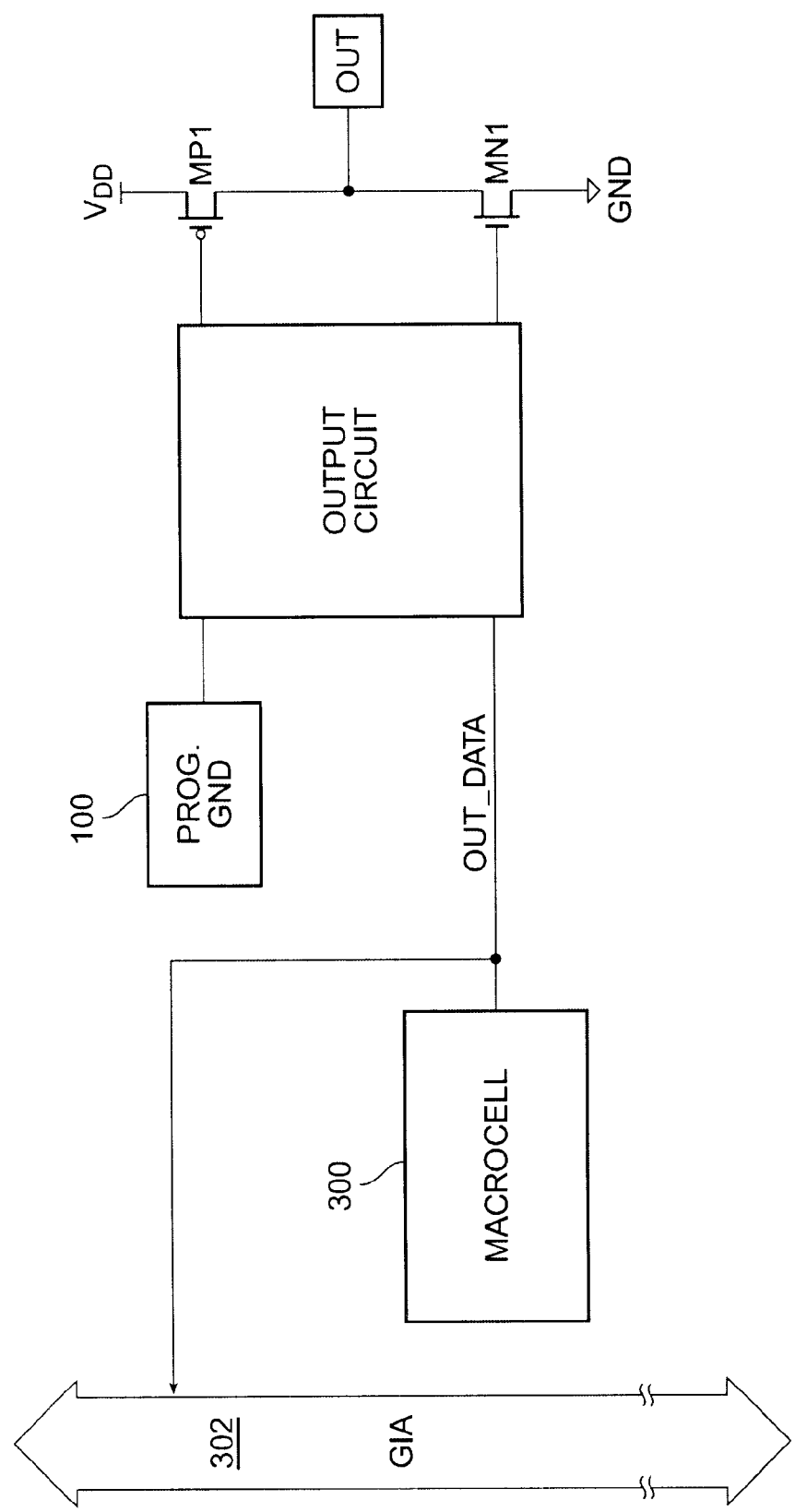
FIG. 4 is a simplified block diagram of the programmable output control circuit in the context of a programmable logic device.

Another significant advantage of the programmable grounding technique of the present invention is realized in the context of programmable logic devices. FIG. 4 is a simplified block diagram of the programmable output control circuit of FIG. 2 in the context of a programmable logic device (PLD). A PLD is typically made up of a large number of programmable logic elements, or macrocells, that are interconnected by an interconnect array. FIG. 4 shows a single output macrocell 300 whose output connects to a global interconnect array GIA 302, as well as the SPEED_DATA input of the output driver circuit an example of which is shown in FIG. 3. In conventional programmable logic devices, to programmably ground an unused output pin, a macrocell, such as macrocell 200, would be programmed to drive output node OUT to ground. This results in sacrificing all the resources of a macrocell for grounding the unused output. When operating in the programmable ground mode (i.e., when programmable element 100 is programmed high), the present invention does not require a dedicated macrocell to drive the output node to ground. This allows macrocell 200 to still be used as a buried macrocell. A buried macrocell refers to a macrocell that does not have independent output capability but its resources can be used for other purposes. As shown in FIG. 4, an architecture bit is used as programmable element 100 for grounding of the output, while the output of macrocell 300 connects to a global interconnect array GIA 302, allowing it to be used as a buried macrocell.

In conclusion, the present invention provides circuit techniques for programmably grounding (or coupling to VCC) unused output pins to improve noise immunity of an integrated circuit, without sacrificing the speed of operation of the circuit. while the above is a complete description of the preferred embodiment of the present invention, it is possible to use various alternatives, modifications and equivalents. For example, certain circuits may employ more than one set of internal power supply buses (ground and VCC) to power various parts of the circuitry. A circuit may include an internal "quite" ground bus that supplies ground to the more noise sensitive sections of the circuitry, and a "noisy" ground bus that supplies ground to, for example, the I/O circuitry. In such circuits, the technique of the present invention would preferably apply to the "noisy" ground bus instead of the "quiet" ground bus. Other circuits may divide the pulldown transistors (MN1) into several parallel connected transistors that are turned on at different times to provide for slew rate control when driving the output node. For an unused pin, the present invention would preferably enable all parallel-connected transistors to maximize the capacitance. Therefore, the scope of the present invention should be determined not with reference to the above description but should, instead, be determined with reference to the appended claims, along with their full scope of equivalents.

What is claimed is:

1. An integrated circuit comprising:
   internal circuitry configured to perform logic functions;
   an output driver circuit having a first input coupled to an output enable signal and a second input coupled to an output data signal, and an output connected to an output pad; and
   programmable ground circuitry comprising:
      a speed critical signal path coupled between the internal circuitry and the output driver circuit, and
      a test signal path coupled between a programmable ground signal and the output driver circuit,
   wherein, in a first mode of operation, the output driver circuit responds to a signal from the speed critical signal path, and in a second mode of operation the output driver circuit drives the output pad to ground in response to the programmable ground signal from the test signal path.

2. The integrated circuit of claim 1 wherein the output driver circuit comprises:
   a pull-up transistor having current-carrying terminals coupled between the output pad and a power supply node; and
   a pull-down transistor having current-carrying terminals coupled between the output pad and a ground node.

3. The integrated circuit of claim 2 wherein the output driver circuit further comprises control logic receiving the output enable signal and the output data signal, the control logic signal being configured to drive control terminals of the pull-up and pull-down transistors in response to the output enable signal and the output data signal.

4. The integrated circuit of claim 3 wherein the speed critical signal path comprises a first selection circuit having a first input coupled to the internal circuitry for receiving speed critical data, a second input coupled to receive other data, and an output coupled to the second input of the output driver circuit.

5. The integrated circuit of claim 4 wherein the speed critical signal path further comprises a second selection circuit having a first input coupled to the internal circuitry for receiving speed critical output enable signal, a second input coupled to receive other output enable signal, and an output coupled to the first input of the output driver circuit.

6. The integrated circuit of claim 5 further comprising a reprogrammable element configured to generate the programmable ground signal.

7. The integrated circuit of claim 6 wherein the test signal path comprises a third selection circuit having a first input coupled to receive test data, a second input coupled to the programmable element, and an output coupled to the second input of the first selection circuit.

8. The integrated circuit of claim 7 wherein the test signal path further comprises a fourth selection circuit having a first input coupled to receive test output enable data, a second input coupled to the programmable element, and an output coupled to the second input of the second selection circuit.

9. The integrated circuit of claim 8 wherein in the first mode of operation the first and third selection circuits are configured to pass the speed critical data to the second input of the output driver circuit, and the second and third selection circuits are configured to pass the speed critical output enable signal to the first input of the output driver circuit.

10. The integrated circuit of claim 9 wherein in the second mode of operation the first and third selection circuits are configured to pass a grounding signal from the reprogrammable element to the second input of the output driver circuit, and the second and third selection circuits are configured to pass a grounding enable signal to the first input of the output driver circuit.

11. The integrated circuit of claim 10 wherein in a third mode of operation the first and third selection circuits are configured to pass test data to the second input of the output driver circuit, and the second and third selection circuits are configured to pass a test output enable signal to the first input of the output driver circuit.

12. The integrated circuit of claim 11, wherein, the third mode of operation overrides the second mode of operation.

13. The integrated circuit of claim 12 wherein the third mode of operation allows boundary scan testing to be performed on output terminals of the integrated circuit.

14. The integrated circuit of claim 8 wherein the first and second selection circuits comprise CMOS transmission gates.

15. The integrated circuit of claim 1 wherein the internal circuitry comprises programmable logic having a plurality of macrocells, and wherein the programmable ground signal is generated by a dedicated reprogrammable element.

16. In an integrated circuit, an output circuit for driving an output node, comprising:
   a test circuit path coupling a signal from internal testing circuitry to the output node; and
   a speed critical circuit path coupling a signal from internal logic circuitry to the output node,
   wherein, when the output node is unused, the output circuit couples the output node to an internal power bus via the test circuit path.

17. The output circuit of claim 16 further comprising a reprogrammable element coupled to the output circuit, wherein, the output circuit couples the output node to the internal power bus via the test circuit, in response to a programmed state of the reprogrammable element.

18. The output circuit of claim 17 further comprising a pull-up transistor coupling the output node to an internal positive power supply bus, and a pull-down transistor coupling the output node to an internal ground bus.

19. The output circuit of claim 18 wherein the speed critical circuit path comprises a selection circuit having a first input coupled to receive the signal from internal logic circuitry, a second input, and an output coupled to the pull-up and pull-down transistors.

20. The output circuit of claim 19 wherein the test circuit path comprises a selection circuit having a first input coupled to receive the signal from the output testing circuitry, a second input coupled to the reprogrammable element, and an output coupled to the second input of the selection circuit in the speed critical circuit path.

21. The output circuit of claim 20, wherein in a first mode of operation the selection circuit in the speed critical circuit path is configured to pass the signal from the internal logic circuitry,
   in a second mode of operation, the selection circuit in the speed critical circuit path and the selection circuit in the test circuit path are configured to pass signal from the output testing circuitry, and in a third mode of operation, the selection circuit in the speed critical path and the selection circuit in the test circuit path are configured to pass a signal representing the state of the reprogrammable element.

22. The output circuit of claim 21 wherein the output testing circuitry comprises standard boundary scan test circuitry.

23. The output circuit of claim 18 wherein the internal power bus is the ground bus.

24. The output circuit of claim 18 wherein the internal power bus is the positive power supply node.

25. The output circuit of claim 16 wherein the integrated circuit comprises a quiet ground bus and a noisy ground bus, and wherein the internal power bus is the noisy ground bus.

26. A programmable logic device comprising:

a plurality of macrocells interconnected by an array of interconnect lines;

internal testing circuitry; and a plurality of output circuits driving a respective plurality of output nodes, wherein each one of the plurality of output circuits comprises a programmable element for grounding an associated output node via the internal testing circuitry, when the associated output node is unused.

27. The programmable logic device of claim 26, wherein when an unused output node is grounded, an associated macrocell is available as a buried macrocell.

28. The programmable logic device of claim 26, wherein the internal testing circuitry comprises boundary scan test circuitry.

* * * * *